(12) United States Patent
Sudarmani et al.

(10) Patent No.: US 11,281,530 B2
(45) Date of Patent: Mar. 22, 2022

(54) METHOD AND SYSTEM FOR VALIDATING A MEMORY DEVICE

(71) Applicant: SAMSUNG ELECTRONICS CO., LTD., Suwon-si (KR)

(72) Inventors: Rengaraja Sudarmani, Seongnam-si (KR); Prathiksha Gautham, Bengaluru (IN); Uday Kumar N B, Bengaluru (IN); Abhinav Sharma, Ann Arbor, MI (US); Sachin Suresh Upadhya, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/034,656

(22) Filed: Sep. 28, 2020

(65) Prior Publication Data

US 2022/0043708 A1    Feb. 10, 2022

(30) Foreign Application Priority Data

Aug. 10, 2020  (IN) .............................. 202041034170

(51) Int. Cl.
*G06F 11/10* (2006.01)
*G06F 11/27* (2006.01)
*G06F 11/07* (2006.01)
*G06F 11/263* (2006.01)
(Continued)

(52) U.S. Cl.
CPC ........ *G06F 11/1068* (2013.01); *G06F 11/076* (2013.01); *G06F 11/0751* (2013.01); *G06F 11/0772* (2013.01); *G06F 11/263* (2013.01); *G06F 11/27* (2013.01); *G06F 11/277* (2013.01); *G06F 11/3037* (2013.01)

(58) Field of Classification Search
CPC ............... G06F 11/1068; G06F 11/076; G06F 11/0772; G06F 11/263; G06F 11/3037; G06F 11/0751; G06F 11/27; G06F 11/277
USPC .......... 714/764, 763, 766, 718, 719, 720, 42
See application file for complete search history.

(56) References Cited

U.S. PATENT DOCUMENTS

| | | | | |
|---|---|---|---|---|
| 4,503,536 | A | * | 3/1985 | Panzer .................. G06F 11/277 714/732 |
| 5,673,388 | A | * | 9/1997 | Murthi .................. G11C 29/26 714/42 |

(Continued)

OTHER PUBLICATIONS

Jun, "HBM (High Bandwidth Memory) for 2.5D", Sep. 2-4, 2015, 27 pages.

(Continued)

*Primary Examiner* — John J Tabone, Jr.
(74) *Attorney, Agent, or Firm* — F. Chau & Associates, LLC

(57) ABSTRACT

The present invention relates to a method of validating a memory device. The method includes validating a second memory device based on one or more first microcode instructions stored in a validated predetermined part of a first memory device to detect the operational status of the second memory device. Further, the method includes receiving one or more second microcode instructions upon validating the second memory device. Finally, validating the first memory device based on the one or more second microcode instructions stored in the second memory device to detect the operational status of the first memory device.

20 Claims, 6 Drawing Sheets

(51) Int. Cl.
*G06F 11/30* (2006.01)
*G06F 11/277* (2006.01)

(56) References Cited

U.S. PATENT DOCUMENTS

| | | | | |
|---|---|---|---|---|
| 5,901,330 | A * | 5/1999 | Sun | G07F 7/1008 710/8 |
| 6,000,048 | A * | 12/1999 | Krishna | G01R 31/3187 714/42 |
| 6,032,270 | A * | 2/2000 | Furukawa | G06F 11/3648 714/49 |
| 6,161,206 | A * | 12/2000 | Wasson | G01R 31/3921 714/738 |
| 6,598,112 | B1 * | 7/2003 | Jordan | G06F 9/445 711/2 |
| 7,337,378 | B2 * | 2/2008 | Kondou | G11C 29/16 365/201 |
| 9,881,693 | B2 | 1/2018 | Kondo et al. | |
| 10,151,796 | B2 * | 12/2018 | Shibahara | G06F 11/27 |
| 2003/0074620 | A1 | 4/2003 | Dorsey | |
| 2004/0059437 | A1 * | 3/2004 | Cullen | G01R 31/31919 700/11 |
| 2006/0161829 | A1 * | 7/2006 | Kobayashi | G01R 31/31919 714/738 |
| 2018/0068697 | A1 * | 3/2018 | Usuda | G11C 7/10 |
| 2018/0308561 | A1 | 10/2018 | Koker et al. | |

OTHER PUBLICATIONS

Landrault, "Functional RAM Testing", 72 pages.
Li, "Chapter 4: Memory Built-in Self-Test", Dept. of Electrical Engineering, National Central University, Jhongli, Taiwan, 53 pages.
Pavlov, "Design and Test of Embedded SRAMs", University of Waterloo, Waterloo, Ontario, Canada, 2005, 205 pages.
Lin, et al., "A Novel Controllable BIST Circuit for embedded SRAM", The Open Electrical & Electronic Engineering Journal, 2016, pp. 1-10.
Park, et al., "A Flexible Programmable Memory BIST for Embedded Single-Port Memory and Dual-Port Memory". ETRI Journal, vol. 35, No. 5, Oct. 2013, pp. 808-818.
Martirosyan, et al., "An Efficient Testing Methodology for Embedded Flash Memories", 2017 IEEE East-West Design & Test Symposium (EWDTS), Sep. 19-Oct. 2, 2017, 4 pags.
Wu, "Flash Memory Testing", Lab for Reliable Computing, Dept. Electrical Engineering, National Tsing Hua University, published Apr. 14, 2010, 76 pages.

* cited by examiner

METHOD AND SYSTEM FOR VALIDATING A MEMORY DEVICE

CROSS-REFERENCE TO RELATED APPLICATION

This application claims priority to, and the benefit of, Indian Application No. 202041034170 filed on Aug. 10, 2020. The entire contents of the foregoing application are hereby incorporated by reference for all purposes.

TECHNICAL FIELD

The present disclosure relates to testing of semiconductor-based memory devices. Particularly, but not exclusively, the present disclosure relates to a method for validating a memory device.

BACKGROUND

Volatile memory devices are memory devices that store data when supplied with electric power. Semiconductor memory devices such as SRAM (Static Random-Access Memory), DRAM (Dynamic Random-Access Memory), and SDRAM (Synchronous dynamic random-access memory) are examples of volatile memory.

Semiconductor-based volatile memory devices are periodically tested or verified prior to storing data. Either an external or internal testing process may be used to perform the testing. However, in some cases semiconductor memory devices contain embedded memory components that are hard-wired onto a chip and cannot be tested externally. Such embedded memory may only be tested using an internal process. Therefore, there is a need in the art for a robust built-in self-testing process to test embedded memory components.

The information disclosed in this background of the disclosure section is only for enhancement of understanding of the general background of the present disclosure and should not be taken as an acknowledgment or any form of suggestion that this information forms the prior art already known to a person skilled in the art.

SUMMARY

Disclosed herein is a method of validating a memory device, the method comprises validating a second memory device based on one or more first microcode instructions stored in a validated predetermined part of a first memory device to detect an operational status of the second memory device. Further, the method comprises receiving one or more second microcode instructions, upon validating the second memory device. Finally, validating the first memory device based on the one or more second microcode instructions stored in the second memory device to detect the operational status of the first memory device.

Embodiments of the present disclosure present a testing system for validating a memory device, the testing system comprises a processor and a memory communicatively coupled to the processor. The memory stores the processor instructions, which, on execution, causes the processor to validate a second memory device based on one or more first microcode instructions stored in a validated predetermined part of a first memory device to detect an operational status of the second memory device. Further, the instructions cause the processor to receive one or more second microcode instructions, upon validating the second memory device. Finally, the instructions cause the processor to validate the first memory device based on the one or more second microcode instructions stored in the second memory device to detect the operational status of the first memory device.

Embodiments of the present disclosure provide a method of validating a memory of an electronic device comprising a first memory device and a second memory device. The method may include validating a predetermined part of the first memory device using one or more predetermined microcode instructions; storing one or more first microcode instructions in the predetermined part of the first memory device based at least in part on validating the predetermined part of the first memory device; validating the second memory device using the one or more first microcode instructions; storing one or more second microcode instructions in the second memory device based at least in part on validating the second memory device; and validating the first memory device using the one or more second microde instructions.

The foregoing summary is illustrative only and is not intended to be in any way limiting. In addition to the illustrative aspects, embodiments, and features described above, further aspects, embodiments, and features may become apparent by reference to the drawings and the following detailed description.

BRIEF DESCRIPTION OF THE ACCOMPANYING DRAWINGS

The novel features and characteristics of the disclosure are set forth in the appended claims. The disclosure itself, however, as well as a preferred mode of use, further objectives and advantages thereof, may best be understood by reference to the following detailed description of an illustrative embodiment when read in conjunction with the accompanying drawings. The accompanying drawings, which are incorporated in and constitute a part of this disclosure, illustrate exemplary embodiments and, together with the description, serve to explain the disclosed principles. In the figures, the left-most digit(s) of a reference number identifies the figure in which the reference number first appears. One or more embodiments are now described, by way of example only, with reference to the accompanying figures wherein like reference numerals represent like elements and in which:

Figure 1:
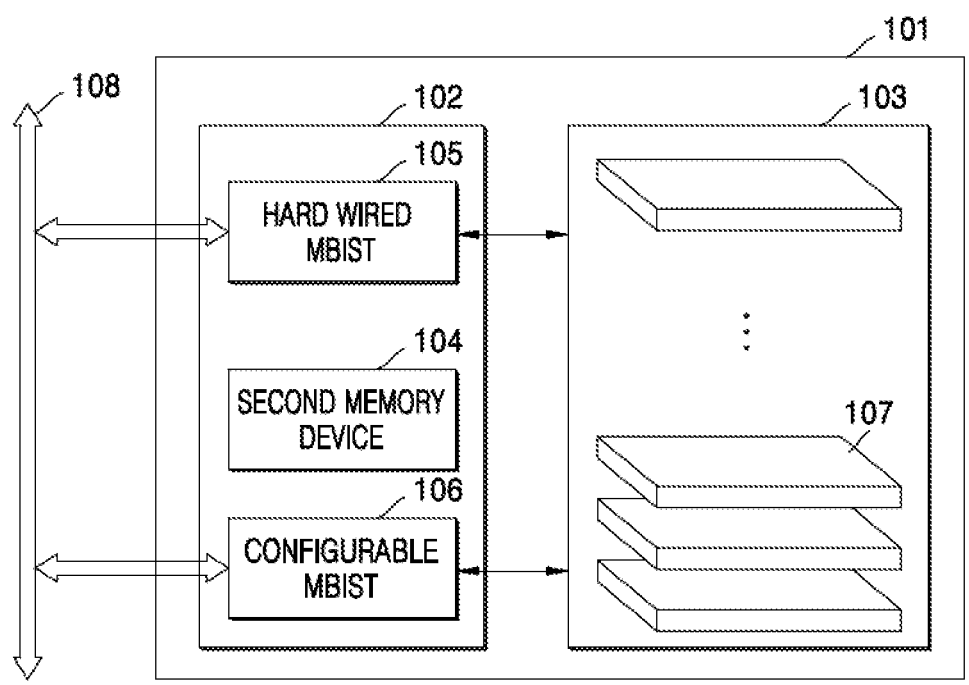
FIG. 1 shows an exemplary environment for validating a memory device, in accordance with some embodiments of the present disclosure.

It should be appreciated by those skilled in the art that any block diagrams herein represent conceptual views of illustrative systems embodying the principles of the present subject matter. Similarly, it may be appreciated that any flow charts, flow diagrams, state transition diagrams, pseudo code, and the like represent various processes which may be substantially represented in a computer-readable medium and executed by a computer or processor, whether or not such computer or processor is explicitly shown.

DETAILED DESCRIPTION

Embodiments of the present disclosure present a method of validating a memory device. Semiconductor-based memory devices are tested or verified periodically before storing data in the memory device. The testing of the memory device may be performed by an external tester, such as a piece of automatic test equipment (ATE). Testing my also be performed internally in the memory device.

Complex system-on-a-chip (SoC) structures, such as ASIC chips, may have large scale memories. The embedded memory may include SRAM (Static Random-Access Memory), DRAM (Dynamic Random-Access Memory), cache, register file, and flash memory. The embedded memory of the SoC chip may be located inside the chip. Therefore, the embedded memory may not be accessible from the outside of the device for testing. As a result, a Memory built-in self-test (MBIST) system may be used in the SoC for testing embedded memory arrays on the SoC.

MBIST systems may include an SRAM component for generating test patterns based on a microcode stored in the SRAM. Embodiments of the present disclosure may be used to test or validate the SRAM associated with the MBIST system deployed in the SoC. An example method includes validating a second memory device based on one or more first microcode instructions stored in a validated predetermined part of a first memory device to detect an operational status of the second memory device. Additionally, the method may include receiving one or more second microcode instructions upon validating the second memory device. Finally, the first memory device may be validated based on the one or more second microcode instructions stored in the second memory device to detect the operational status of the first memory device.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiments thereof have been shown by way of example in the drawings and may be described in detail below. It should be understood, however that the drawings are not intended to limit the disclosure to the particular forms disclosed, but on the contrary, the disclosure is to cover all modifications, equivalents, and alternative falling within the scope of the disclosure.

The terms "comprises", "includes" "comprising", "including" or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" or "includes . . . a" does not, without more constraints, preclude the existence of other elements or additional elements in the system or apparatus.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

FIG. 1 shows an exemplary environment for validating a memory device, in accordance with some embodiments of the present disclosure.

The present disclosure presents a method of validating or testing a memory device (101). The memory device (101) may be semiconductor-based. In an example embodiment, one or more memory devices are embedded in a System-on-a-Chip (SoC). The SoC is an integrated circuit that integrates one or more components of a computer system or other electronic system. The one or more components include a central processing unit (CPU), memory, input/output ports, and secondary storage. Further, the SoC may include at least one of digital, analog, mixed-signal, and radio frequency signal processing functions. The memory device (101) in the SoC detects manufacturing defects and performs robust testing of large memory blocks post-manufacturing. The one or more memory devices in the Soc is validated using a memory built-in self-test system. The one or more memory devices in the Soc is validated during at least one of a startup or offline self-tests runs when SoC boots up, before the starting of user application, online (i.e., run-time) self-test triggered by the user application and shutdown self-test executed at the end of the user application.

In an example embodiment, the memory device (101) includes a first memory device (103), as shown in FIG. 1. The first memory device (103) may include at least one of a Static Random-Access Memory (SRAM), a Dynamic Random-Access Memory (DRAM), one or more SRAM slices, one or more DRAM slices, and the like. The first memory device (103) is validated using a testing system (102). The testing system (102) may include at least one of a hard-wired Memory, Built-in Self-Test (MBIST) (105), and a configurable MBIST (106), as shown in FIG. 1. The hard-wired MBIST (105) is a hardware realization of a memory testing technique. The configurable MBIST (106) is implemented using at least one of microcode based MBIST and processor-based MBIST. The microcode based MBIST is used to validate the memory device (101) using a controller or a processor and a memory for storing a set of predefined instructions, or microcodes used to generate the selected test technique. The processor-based MBIST is used to validate one or more memory devices in the SoC. The processor-based MBIST executes an assembly-language to generate test patterns for validating the one or more memory devices. The microcode based MBIST and processor-based MBIST includes a second memory device (104) (for example, the SRAM and the like) used to store assembly-language or microcodes associated with the selected test technique for validating the first memory device (103).

In an example embodiment, the memory device (101) may be High Bandwidth Memory (HBM), but the present disclosure is not limited thereto. The one or more DRAM slices stacked in a three-dimension may be denoted as a High Bandwidth memory, as shown in FIG. 1. Further, the HBM may include a memory controller (not shown in the figure) and the testing system (102).

In an example embodiment, the testing system (102) is used to validate a predetermined part (107) of the first memory device (103) using the hard-wired MBIST (105). For example, the predetermined part (107) may include one of one DRAM slice of the first memory device (103), a portion (for example, 50% of the memory cells) of the at least one DRAM slice, a count of memory cells used to store one or more first microcode instructions and the like. The validation of the predetermined part (107) includes detecting one of a correct working of the predetermined part (107) of the first memory device (103) or one or more errors in the predetermined part (107) of the first memory device (103). Upon successful validation of the predetermined part (107) of the first memory device (103), the testing system (102) may receive one or more first microcode instructions using an IEEE 1500 bus interface. Further, the testing system (102) stores the one or more first microcode instructions in the predetermined part (107) of the first memory device (103).

Further, in an example embodiment, the testing system (102) validates the second memory device (104) based on the one or more first microcode instructions stored in a validated predetermined part (107) of a first memory device (103). The second memory device (104) may be validated by the configurable MBIST (106) of the testing system (102) using the one or more first microcode instructions. The validation of the second memory device (104) includes detecting the operational status of the second memory device (104). Detecting the operational status includes one of the correct working of the second memory device (104) or the one or more errors in the second memory device (104). Upon successful validation of the second memory device (104), the testing system (102) may receive one or more second microcode instructions using an IEEE 1500 bus interface. The testing system (102) stores one or more second microcode instructions in the second memory device (104). In another embodiment, the testing system (102) may fetch the one or more first microcode instructions from the first memory device (103). Additionally or alternatively, the testing system (102) then stores the one or more first microcode instructions in the second memory device (104). The one or more first microcode instructions are indicative of the one or more second microcode instructions.

Furthermore, in an example embodiment, the testing system (102) validates the first memory device (103) based on the one or more second microcode instructions stored in the second memory device (104). The configurable MBIST (106) of the testing system (102) may be used to validate the first memory device (103) using the one or more second microcode instructions. The validation of the first memory device (103) includes detecting the operational status of the first memory device (103). Detecting the operational status may include one of the correct working of the first memory device (103) or the one or more errors in the first memory device (103).

In an example embodiment, the one or more errors, for example, may include at least one of stuck-at faults, transition faults, coupling faults, inverse coupling faults, idempotent coupling faults, state coupling faults, neighborhood pattern sensitive faults, address decoder faults and the like.

In an example embodiment, the one or more first microcode instruction and the one or more second microcode instructions may be associated with one or more testing techniques. The one or more testing techniques may include at least one of a checkerboard technique, sliding diagonal technique, butterfly technique, march-based test techniques, and the like.

In an example embodiment, the one or more first microcode instruction and the one or more second microcode instructions are indicated using a binary string of ones and zeros. For example, "0111010", "10010011" and the like.

Figure 2:
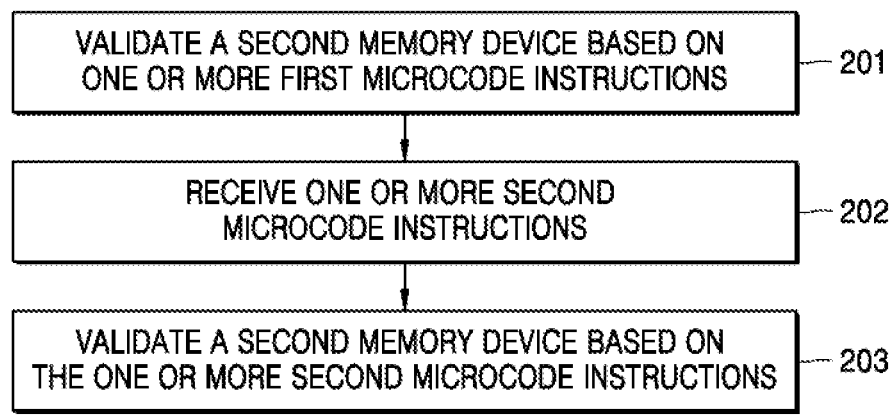
FIG. 2 shows a flowchart illustrating method steps for validating a memory device, in accordance with some embodiment of the present disclosure.

FIG. 2 shows a flowchart illustrating method steps for validating a memory device (101), in accordance with some embodiment of the present disclosure.

The order in which the method 200 may be described is not intended to be construed as a limitation, and any number of the described method blocks may be combined in any order to implement the method. Additionally or alternatively, individual blocks may be deleted from the methods without departing from the scope of the subject matter described herein. Furthermore, the method may be implemented in any suitable hardware, software, firmware, or combination thereof.

At operation 201, the testing system (102) detects the operational status of the second memory device (104) by validating the second memory device (104) based on the one or more first microcode instructions stored in the validated predetermined part (107) of the first memory device (103).

Figure 3A:
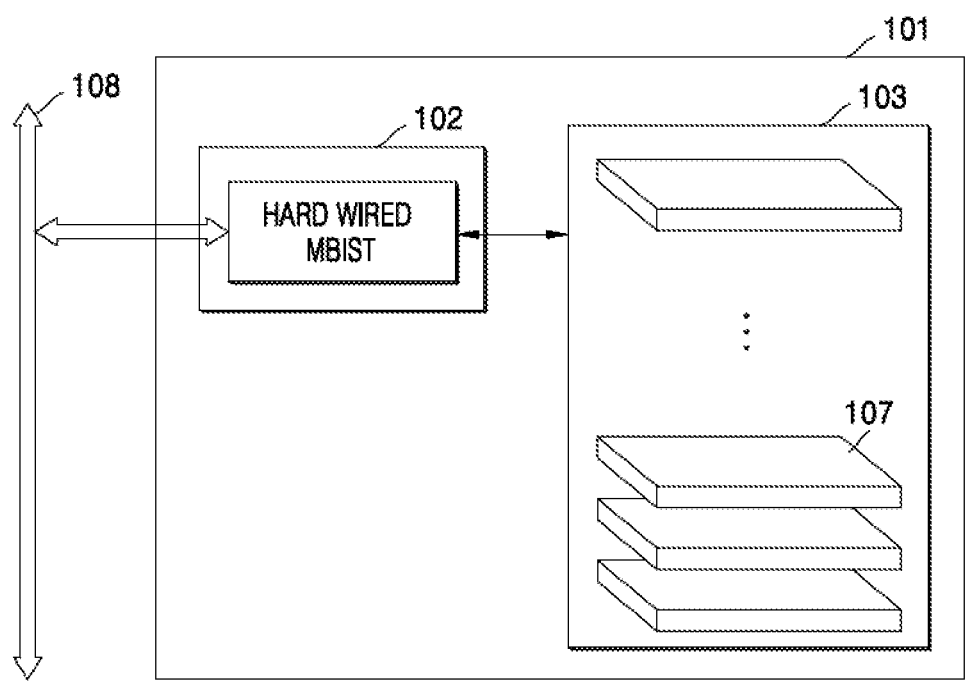
FIG. 3A shows an exemplary illustration of validating a portion of the first memory device, in accordance with some embodiments of the present disclosure.
Figure 3B:
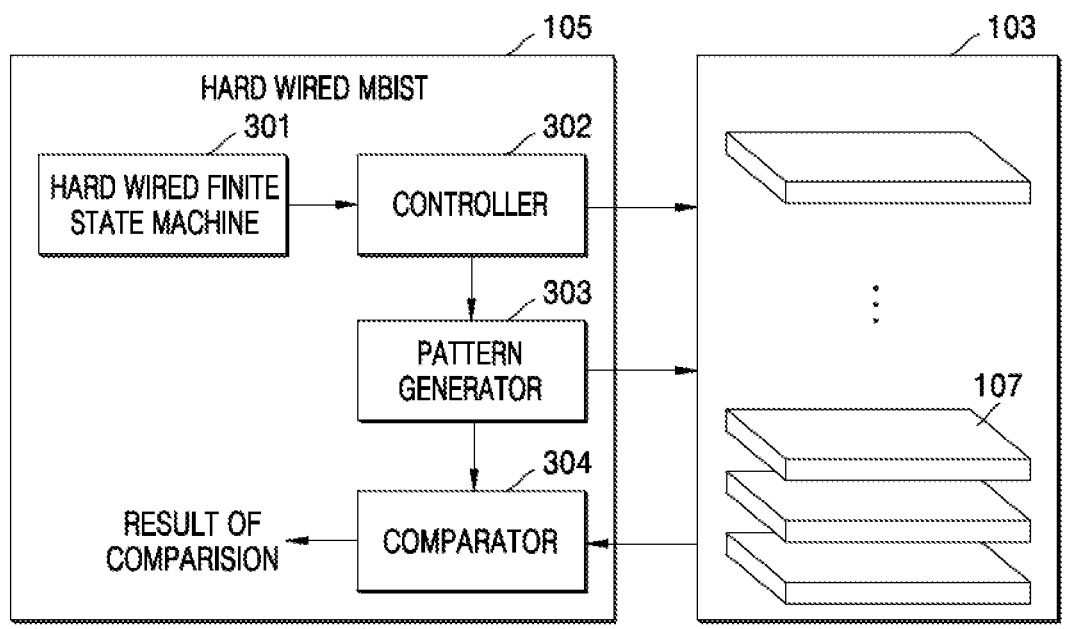
FIG. 3B shows an exemplary illustration of hard-wired MBIST for validating a portion of the first memory device, in accordance with some embodiments of the present disclosure.

In an example embodiment, the testing system (102) validates the predetermined part (107) of the first memory device (103) using the hard-wired MBIST (105) as shown in FIG. 3A. The hard-wired MBIST (105) executes the one or more predefined microcode instructions to detect one of the correct working of the predetermined part (107) of the first memory device (103) or one or more errors in the predetermined part (107) of the first memory device (103) as shown in FIG. 3B. The predetermined part (107) includes a portion of the first memory device (103). The size of the predetermined part (107) may be equal to the size of the one or more first microcode instructions to be stored in the first memory device (103). The first memory device (103) includes one or more SRAM slices, one or more DRAM slices, high bandwidth memory, a combination thereof and the like.

In an example embodiment, the hard-wired MBIST (105) is a hardware realization of a selected memory test technique. The memory test technique may be stored in the form of a Finite State Machine (FSM) (301), which may be hard-wired, as shown in FIG. 3B. The FSM is used to generate the one or more predefined microcode instructions using a controller (302) and a pattern generator (303). A person skilled in the art will appreciate the existence of different implementations of the hard-wired MBIST (105).

In some examples, the one or more predefined microcode instructions may be provided to the predetermined part (107) of the first memory device (103). The first memory device (103) executes the read or write operation based on the one or more predefined microcode instructions. For example, the one or more predefined microcode instructions may indicate to the first memory device (103) to write a logic zero to a memory cell in the predetermined part (107) and read a data value stored in the memory cell. The result of the execution of the one or more predefined microcode in the predetermined part (107) is received by a comparator (304), as shown in FIG. 3B.

The comparator (304) compares the one or more predefined microcode instructions with the result of the execution received from the predetermined part (107) of the first memory device (103). The result of the comparison indicates the detection of the correct working of the predetermined part (107) of the one or more errors in the predetermined part (107) of the first memory device (103). For example, if the data value read from the predetermined part (107) indicates a logic zero, and the one or more predefined microcode instructions indicate the data value as logic one, then the comparator (304) detects the one or more errors. Alternatively, if the data value read from the predetermined part (107) indicates a logic zero, and the one or more predefined microcode instructions indicate the data value as logic zero, then the comparator (304) detects the correct working of the memory cell in the predefined part of the first memory device (103).

Figure 3C:
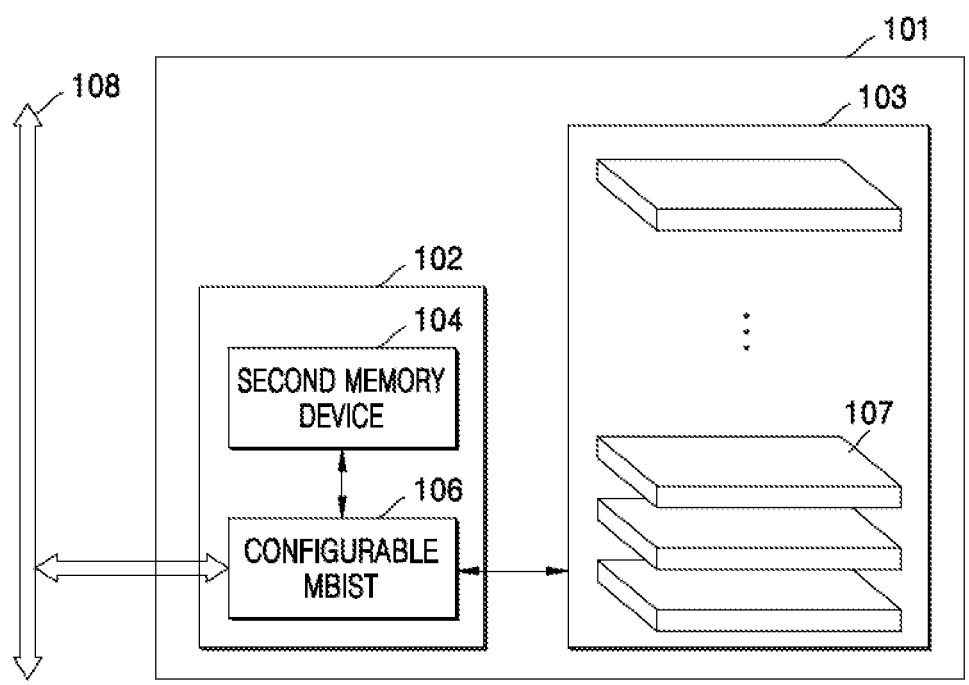
FIG. 3C shows an exemplary illustration of validating the second memory device, in accordance with some embodiments of the present disclosure.

In an example embodiment, after validation of the predetermined part (107) of the first memory device (103), the testing system (102) receives the one or more first microcode instructions using a bus interface (108), which according to one example may be an IEEE 1500 bus interface. The one or more first microcode instructions are stored in the predetermined part (107) of the first memory device (103), as shown in FIG. 3C. Further, the testing system (102) validates the second memory device (104) using the configurable MBIST (106). The configurable MBIST (106) fetches the one or more first microcode instructions from the first memory device (103). Further, the configurable MBIST (106) provides the one or more first microcode instructions to the second memory device (104), as shown in FIG. 3C.

The second memory device (104) executes the one or more first microcode instructions and provides a result of the execution to the configurable MBIST (106). The one or more first microcode instructions may include reading or writing the binary logical value of zero or one to the one or more memory cells in the first memory device (103). The configurable MBIST (106) detects the operational status of the second memory device (104) based on the result of execution. The operational status includes one of the correct working of the second memory device (104) or one or more errors in the second memory device (104). The operational status is detected as correct working when the result of the execution is matching with the one or more first microcode instructions. The operational status is detected as the one or more errors in the second memory device (104) when the result of the execution is mismatching with the one or more first microcode instructions.

Referring back to FIG. 2, at the operation 202, upon validating the second memory device (104), the configurable MBIST (106) of the testing system (102) receives the one or more second microcode instructions.

Figure 3D:
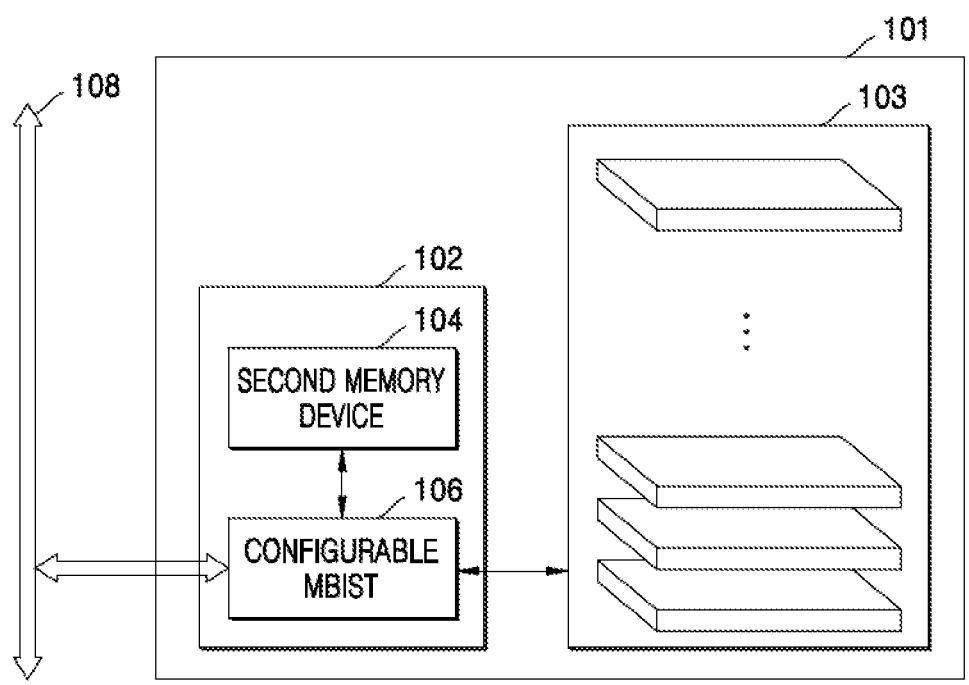
FIG. 3D shows an exemplary illustration of validating the first memory device, in accordance with some embodiments of the present disclosure.

In an example embodiment, the configurable MBIST (106) receives the one or more second microcode instructions by fetching the one or more first microcode instructions from the first memory device (103). The one or more first microcode instructions are indicative of the one or more second microcode instructions. Further, the one or more second microcode instructions are stored in the second memory device (104). In another example embodiment, the configurable MBIST (106) receives the one or more second microcode instructions using the bus interface (108). Further, the one or more second microcode instructions are stored in the second memory device (104), as shown in FIG. 3D.

Referring back to FIG. 2, at operation 203, the testing system (102) validates the first memory device (103) based on the one or more second microcode instructions stored in the second memory device (104) to detect the operational status of the first memory device (103).

In an example embodiment, the configurable MBIST (106) of the testing system (102) validates the first memory device (103) by fetching the one or more second microcode instructions from the second memory device (104). Further, the configurable MBIST (106) provides the one or more second microcode instructions to the first memory device (103), as shown in FIG. 3D. The first memory device (103) executes the one or more second microcode instructions and provides the result of execution to the configurable MBIST (106). The configurable MBIST (106) detects the operational status including one of the correct working of the first memory device (103) or one or more errors in the first memory device (103). The operational status may be detected as correct working when the result of the execution is matching with the one or more second microcode instructions. The operational status may be detected as the one or more errors in the first memory device (103) when the result of the execution is mismatching with the one or more second microcode instructions.

The method of validating the memory device (101) includes a configurable MBIST (106) for testing and validating the first memory device (103). The configurable MBIST (106) may be used to test and validate the second memory device (104) associated with the configurable MBIST (106). The method of validating the memory device (101) eliminates the need for additional hardware to test the second memory device (104). The first memory device (103) and the second memory device (104) are tested and validated using one or more testing techniques by generating random patterns based on the one or more first and second microcode instructions. Further, the configurable MBIST (106) can be used to generate complex patterns to detect the one or more errors in the memory device (101).

Accordingly, embodiments of the present disclosure provide a method of validating a memory of an electronic device (e.g., the memory device 101) comprising a first memory device (103) and a second memory device (104). The method may include validating a predetermined part (107) of the first memory device (103) using one or more predetermined microcode instructions; storing one or more first microcode instructions in the predetermined part (107) of the first memory device (103) based at least in part on validating the predetermined part (107) of the first memory device (103); validating the second memory device (104) using the one or more first microcode instructions; storing one or more second microcode instructions in the second memory device (104) based at least in part on validating the second memory device (104); and validating the first memory device (103) using the one or more second microde instructions.

The terms "an embodiment", "an example embodiment", "embodiment", "embodiments", "the embodiment", "the embodiments", "one or more embodiments", "some embodiments", and "one embodiment" mean "one or more (but not all) embodiments of the present disclosure(s)" unless expressly specified otherwise.

The terms "including", "comprising", "having" and variations thereof mean "including but not limited to", unless expressly specified otherwise.

The enumerated listing of items does not imply that any or all items are mutually exclusive, unless expressly specified otherwise. The terms "a", "an" and "the" mean "one or more", unless expressly specified otherwise.

A description of an example embodiment with several components in communication with each other does not imply that all such components are used or required. On the contrary, a variety of optional components are described to illustrate the wide variety of possible embodiments of the present disclosure.

When a single device or article is described herein, it may be readily apparent that more than one device and/or article (whether or not the device and/or article cooperate) may be used in place of a single device and/or article. Similarly, where more than one device or article is described herein (whether or not device and/or article cooperate), it may be readily apparent that a single device/article may be used in place of the more than one device or article or a different number of devices/articles may be used instead of the shown number of devices or programs. The functionality and/or the features of a device may be alternatively embodied by one or more other devices which are not explicitly described with such functionality/features. Therefore, other embodiments of the present disclosure need not include the device itself.

The illustrated operations of FIG. 2 shows certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and the language used may not have been selected to delineate or circumscribe the inventive subject matter. It is therefore intended that the scope of the present disclosure may be limited not by this detailed description, but rather by any claims that issue on an application based here on. Accordingly, the disclosure of the embodiments of the present disclosure is intended to be illustrative, but not limiting, of the scope of the present disclosure, which is set forth in the following claims.

While various aspects and embodiments have been disclosed herein, other aspects and embodiments may be apparent to those skilled in the art. The various aspects and embodiments disclosed herein are for purposes of illustration and are not intended to be limiting, with the true scope being indicated by the following claims.

REFERRAL NUMERALS:

| Reference number | Description |
| --- | --- |
| 101 | Memory device |
| 102 | Testing System |
| 103 | First Memory Device |
| 104 | Second Memory Device |
| 105 | Hard-wired MBIST |
| 106 | Configurable MBIST |
| 107 | Predetermined Part |
| 301 | Hard-wired Finite State Machine |
| 302 | Controller |
| 303 | Pattern Generator |
| 304 | Comparator |

We claim:

1. A method of validating a memory device, the method comprising:
    validating, by a testing system, a second memory device based on one or more first microcode instructions stored in a validated predetermined part of a first memory device to detect an operational status of the second memory device;
    receiving, by the testing system, one or more second microcode instructions, upon validating the second memory device; and
    validating, by the testing system, the first memory device based on the one or more second microcode instructions stored in the second memory device to detect an operational status of the first memory device.

2. The of method of claim 1, wherein the validated predetermined part of the first memory device is validated by a process comprising:
    executing one or more predefined microcode instructions to detect one of:
        a correct working of the validated predetermined part of the first memory device; or
        one or more errors in the validated predetermined part of the first memory device.

3. The of method of claim 1, wherein validating the second memory device comprises:
    fetching the one or more first microcode instructions from the first memory device; and
    executing the one or more first microcode instructions to detect the operational status of the second memory device, the operational status of the second memory device comprising one of:
        a correct working of the second memory device; or
        one or more errors in the second memory device.

4. The of method of claim 1, wherein validating the first memory device comprises:
    fetching the one or more second microcode instructions from the second memory device; and
    executing the one or more second microcode instructions to detect the operational status of the first memory device, the operational status of the first memory device comprising one of:
        a correct working of the first memory device; or
        one or more errors in the first memory device.

5. The of method of claim 2, wherein the one or more errors comprises a cell fault.

6. The of method of claim 1, wherein the first memory device comprises one or more Dynamic Random-Access Memory (DRAM) slice.

7. The of method of claim 1, wherein the second memory device is a Static Random-Access Memory (SRAM).

8. The of method of claim 1, wherein receiving the one or more second microcode instructions comprises one of:
    fetching the one or more first microcode instructions from the first memory device, wherein the one or more first microcode instructions is indicative of the one or more second microcode instructions stored in the second memory device; or
    receiving the one or more second microcode instructions using a IEEE 1500 bus interface, wherein the one or more second microcode instructions are stored in the second memory device.

9. A testing system for validating a memory device, the testing system comprising:
    a processor; and
    a memory communicatively coupled to the processor, wherein the memory stores processor instructions, which, on execution, causes the processor to perform:
        validating a second memory device based on one or more first microcode instructions stored in a validated predetermined part of a first memory device to detect an operational status of the second memory device;
        receiving one or more second microcode instructions, upon validating the second memory device; and validating the first memory device based on the one or more second microcode instructions stored in the second memory device to detect an operational status of the first memory device.

10. The testing system of claim 9, wherein the validated predetermined part of the first memory device is validated using a process comprising:
executing one or more predefined microcode instructions to detect one of:
a correct working of the validated predetermined part of the first memory device; or
one or more errors in the validated predetermined part of the first memory device.

11. The testing system of claim 9, wherein the processor is configured to validate the second memory device using a process comprising:
fetching the one or more first microcode instructions from the first memory device; and
executing the one or more first microcode instructions to detect the operational status of the second memory device, the operational status of the second memory device comprising one of:
a correct working of the second memory device; or
one or more errors in the second memory device.

12. The testing system of claim 9, wherein the processor is configured to validate the first memory device using a process comprising:
fetching the one or more second microcode instructions from the second memory device; and
executing the one or more second microcode instructions to detect the operational status of the first memory device, the operational status of the first memory device comprising one of:
a correct working of the first memory device; or
one or more errors in the first memory device.

13. The testing system of claim 10, wherein the processor is configured to detect the one or more errors including any cell faults.

14. The testing system of claim 9, wherein receiving the one or more second microcode instructions comprises one of:
fetching the one or more first microcode instructions from the first memory device, wherein the one or more first microcode instructions is indicative of the one or more second microcode instructions are stored in the second memory device; or
receiving the one or more second microcode instructions using an IEEE 1500 bus interface, wherein the one or more second microcode instructions are stored in the second memory device.

15. A method of validating a memory of an electronic device comprising a first memory device and a second memory device, the method comprising:
validating a predetermined part of the first memory device using one or more predetermined microcode instructions;
storing one or more first microcode instructions in the predetermined part of the first memory device based at least in part on validating the predetermined part of the first memory device;
validating the second memory device using the one or more first microcode instructions;
storing one or more second microcode instructions in the second memory device based at least in part on validating the second memory device; and
validating the first memory device using the one or more second microcode instructions.

16. The method of claim 15, wherein validating the predetermined part of the first memory device comprises:
generate the one or more predetermined microcode instructions using a controller and a pattern generator;
execute a read or write operation based on the one or more predetermined microcode instructions;
compare the one or more predetermined microcode instructions with a result of the execution; and
determine an operational status of the predetermined part of the first memory device based on the comparison.

17. The method of claim 15, wherein a size of the predetermined part is equal to a size of the one or more predetermined microcode instructions.

18. The method of claim 15, wherein validating the second memory device comprises:
fetching the one or more first microcode instructions from the predetermined part of the first memory device; and
executing the one or more first microcode instructions to detect an operational status of the second memory device.

19. The method of claim 15, wherein validating the first memory device comprises:
fetching the one or more second microcode instructions from the second memory device; and
executing the one or more second microcode instructions to detect an operational status of the first memory device.

20. The method of claim 15, further comprising:
receiving the one or more second microcode instructions from a bus interface.

* * * * *